US006747333B1

United States Patent
Xiang et al.

(10) Patent No.: US 6,747,333 B1
(45) Date of Patent: Jun. 8, 2004

(54) METHOD AND APPARATUS FOR STI USING PASSIVATION MATERIAL FOR TRENCH BOTTOM LINER

(75) Inventors: Qi Xiang, San Jose, CA (US); Philip A. Fisher, Foster City, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/274,401

(22) Filed: Oct. 18, 2002

Related U.S. Application Data

(62) Division of application No. 09/794,894, filed on Feb. 26, 2001, now Pat. No. 6,524,929.

(51) Int. Cl.$^7$ .............................................. H01L 29/00
(52) U.S. Cl. ........................ 257/510; 257/347; 257/506
(58) Field of Search ................... 438/424, 221; 257/506, 510, 513

(56) References Cited

U.S. PATENT DOCUMENTS

| | | |
|---|---|---|
| 4,903,108 A | 2/1990 | Young et al. |
| 4,916,086 A | 4/1990 | Takahashi et al. |
| 5,021,359 A | 6/1991 | Young et al. |
| 5,034,789 A | 7/1991 | Black |
| 5,126,817 A | 6/1992 | Baba et al. |
| 5,258,332 A | 11/1993 | Horioka et al. |
| 5,264,395 A | 11/1993 | Bindal et al. |
| 5,279,865 A | 1/1994 | Chebi et al. |
| 5,405,480 A | 4/1995 | Benzing et al. |
| 5,416,041 A | 5/1995 | Schwalke |
| 5,416,048 A | 5/1995 | Blalock et al. |
| 5,445,988 A | 8/1995 | Schwalke |
| 5,470,802 A | 11/1995 | Gnade et al. |
| 5,497,765 A | 3/1996 | Praud et al. |
| 5,516,710 A | 5/1996 | Boyd et al. |
| 5,569,058 A | 10/1996 | Gnade et al. |

(List continued on next page.)

OTHER PUBLICATIONS

F. Brady et al., Examination of Shallow Trench Isolation for SOI. IEEE 1996, pp. 92–93.*

C.L. Huang et al. Degradation Characteristics of STI and MESA–Isolated Thin–Film SOI CMOS. IEEE 1997, pp. 474–476.*

Ohno, et al. Experimental 0.25–μm–Gate Fully Depleted CMOS/SIMOX Process Using a New Two–Step LOCOS Isolation Technique. IEEE Transactions on Electron Devices, vol. 42, No. 8, (8/95), pps. 1481–1486; retrieved from Internet IEEE Xplore Citation wysiwyg://10/http://ieeexplore.ieee.org/...%2C+Y.%2C+M.%3B+Tsuchiya%2C+T.

*Optimized Shallow Trench Isolation Structure and Its Process for Eliminating Shallow Trench Isolation Induced Parasitic Effects*, IBM Technical Disclosure Bulletin, Apr. 1992, pp. 276–277.

Nanoscale CMOS, Wong, et al., Proceedings of the IEEE, vol. 87, No. 4, Apr. 1999.

*Primary Examiner*—Wael Fahmy
*Assistant Examiner*—Anh Duy Mai
(74) *Attorney, Agent, or Firm*—Renner, Otto, Boisselle & Sklar, LLP

(57) ABSTRACT

A silicon-on-insulator semiconductor device, including a silicon-on-insulator wafer having a silicon active layer, a dielectric isolation layer a silicon substrate, and at least one isolation trench defining an active island in the silicon active layer, in which the silicon active layer is formed on the dielectric insulation layer and the dielectric insulation layer is formed on the silicon substrate, in which the at least one isolation trench includes a layer of a passivating insulator in a lower portion of the isolation trench and in contact with the dielectric insulation layer. The passivating insulator prevents formation of a bird's beak between the silicon active layer and the dielectric insulation layer during subsequent fabrication of the isolation trench.

19 Claims, 5 Drawing Sheets

U.S. PATENT DOCUMENTS

| | | | |
|---|---|---|---|
| 5,578,518 A | 11/1996 | Koike et al. | |
| 5,599,722 A | 2/1997 | Sugisaka et al. | |
| 5,641,711 A | 6/1997 | Cho | |
| 5,646,053 A | 7/1997 | Schepis et al. | |
| 5,683,075 A | 11/1997 | Gaul et al. | |
| 5,741,740 A | 4/1998 | Jang et al. | |
| 5,783,476 A | 7/1998 | Arnold | |
| 5,807,771 A | 9/1998 | Vu et al. | |
| 5,837,612 A | 11/1998 | Ajuria et al. | |
| 5,841,171 A | 11/1998 | Iwamatsu et al. | |
| 5,863,827 A * | 1/1999 | Joyner | 438/424 |
| 5,880,004 A * | 3/1999 | Ho | 438/424 |
| 5,891,803 A | 4/1999 | Gardner | |
| 5,914,280 A | 6/1999 | Gelzinis | |
| 5,915,192 A | 6/1999 | Liaw et al. | |
| 5,981,402 A | 11/1999 | Hsiao et al. | |
| 5,994,756 A | 11/1999 | Umezawa et al. | |
| 6,025,269 A | 2/2000 | Sandhu | |
| 6,037,239 A * | 3/2000 | Jennings | 438/424 |
| 6,046,106 A | 4/2000 | Tran et al. | |
| 6,048,445 A | 4/2000 | Brain | |
| 6,054,206 A | 4/2000 | Mountsier | |
| 6,057,214 A | 5/2000 | Joyner | |
| 6,074,931 A | 6/2000 | Chang et al. | |
| 6,077,768 A | 6/2000 | Ong et al. | |
| 6,096,612 A | 8/2000 | Houston | |
| 6,096,621 A | 8/2000 | Jennings | |
| 6,106,678 A | 8/2000 | Shufflebotham et al. | |
| 6,110,793 A | 8/2000 | Lee et al. | |
| 6,114,741 A | 9/2000 | Joyner et al. | |
| 6,118,167 A | 9/2000 | DiSimone et al. | |
| 6,118,168 A | 9/2000 | Moon et al. | |
| 6,121,148 A | 9/2000 | Bashir et al. | |
| 6,124,212 A | 9/2000 | Fan et al. | |
| 6,127,242 A | 10/2000 | Batra et al. | |
| 6,127,244 A | 10/2000 | Lee | |
| 6,130,467 A | 10/2000 | Bandyopadhyay et al. | |
| 6,136,713 A | 10/2000 | Chen et al. | |
| 6,137,152 A | 10/2000 | Wu | |
| 6,146,970 A | 11/2000 | Witek et al. | |
| 6,147,402 A | 11/2000 | Joshi et al. | |
| 6,150,234 A | 11/2000 | Olsen | |
| 6,165,869 A | 12/2000 | Qian et al. | |
| 6,171,917 B1 | 1/2001 | Sun et al. | |
| 6,171,962 B1 | 1/2001 | Karlsson et al. | |
| 6,174,785 B1 | 1/2001 | Parekh et al. | |
| 6,268,268 B1 | 7/2001 | Tokushige | |
| 6,363,254 B1 | 3/2002 | Jones et al. | |
| 6,368,941 B1 | 4/2002 | Chen et al. | |
| 6,486,038 B1 * | 11/2002 | Maszara et al. | 438/424 |
| 6,521,510 B1 * | 2/2003 | Fisher et al. | 438/424 |
| 6,534,379 B1 * | 3/2003 | Fisher et al. | 438/424 |
| 6,583,488 B1 * | 6/2003 | Xiang | 257/506 |
| 6,657,276 B1 * | 12/2003 | Karlsson et al. | 257/510 |

* cited by examiner

METHOD AND APPARATUS FOR STI USING PASSIVATION MATERIAL FOR TRENCH BOTTOM LINER

CROSS-REFERENCE TO RELATED APPLICATION

This application is a division of, and claims priority under 35 U.S.C. §120 to, U.S. application Ser. No. 09/794,894, filed Feb. 26, 2001, now U.S. Pat. No. 6,524,929.

FIELD OF THE INVENTION

The present invention relates to a method of manufacturing a semiconductor device comprising trench isolation. The invention has particular applicability in manufacturing high density semiconductor devices with submicron design features and active islands isolated by shallow insulated trenches.

BACKGROUND ART

Current demands for high density and performance associated with ultra large scale integration (ULSI) require submicron features of significantly less than 0.25 microns, increased transistor and circuit speeds and improved reliability. Such demands for increased density, performance and reliability require formation of device features with high precision and uniformity.

Conventional semiconductor devices comprise a substrate and various electrically isolated regions or islands, called active regions, active islands or, simply, islands, in which individual circuit components are formed. The electrical isolation of these active islands is typically accomplished by thermal oxidation of the semiconductor substrate, typically monocrystalline silicon or an epitaxial layer formed thereon, bounding the active islands. This type of isolation has been referred to as local oxidation of silicon, or LOCOS.

In an effort to enable the further reduction of the size of semiconductor devices, semiconductor-on-insulator (SOI) wafers increasingly have been used in very-large scale integration (VLSI) or ULSI of semiconductor devices. An SOI wafer typically has a thin layer of silicon on top of a layer of an insulator material. In SOI technology, the semiconductor device is formed entirely in and on the thin layer of silicon, and is isolated from the lower portion of the wafer by the layer of insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer. LOCOS isolation generally is not useful for SOI integrated circuits in VLSI and ULSI semiconductor devices, since it requires too large an area of silicon for oxidation.

Another type of isolation structure is known as trench isolation, wherein shallow isolation trenches are etched in the substrate between the sites of semiconductor devices and an oxide liner is thermally grown on the trench walls. The trench is then refilled with an insulating material. The resulting structure is referred to as a shallow trench isolation (STI) structure. STI has been widely applied to VLSI and ULSI semiconductor devices, and has been applied recently to SOI integrated circuits for such devices.

A typical method of trench formation comprises initially growing a pad oxide layer on the substrate. A nitride layer may be deposited over the pad oxide. A photoresist mask is then applied to define the trench areas. The exposed portions of the nitride layer, if present, are then etched away, followed by etching away of the exposed pad oxide layer. Further etching continues into the thus-exposed substrate to form the shallow trench. When etching of the trench is completed, the photoresist is stripped off the remaining nitride layer.

Next, the substrate is oxidized to form an oxide liner on the walls and base of the trench to control the silicon-silicon dioxide interface quality and to remove etching-induced damage. The trench is then refilled, such as by coating the entire surface of the semiconductor wafer with an insulating material (or "trench fill") such as an oxide, for example, silicon dioxide derived from tetraethyl orthosilicate (TEOS). When a nitride layer is present, the surface may then be planarized, as by chemical-mechanical polishing (CMP) using the nitride layer as a polish stop. In subsequent operations, the nitride and pad oxide are stripped off, and a gate oxide layer is grown on the exposed silicon of the substrate. When no nitride layer is present, the oxide coating is etched back by isotropic etching or polishing, so that the oxide layer remains in the trench. Thereafter, the wafer is further processed to form a semiconductor device.

Shallow trench isolation has several limitations, which may be exacerbated in SOI devices. One problem is that sharp corners at the top of the trench can result in junction leakage currents. More specifically, such sharp corners may cause unwanted increases in the sub-threshold currents in the channel regions along the edge of the device areas when the FETs are switched on. The device threshold voltage can also be lowered. In order to avoid these problems, it has been found desirable to round the corners of such trenches to increase the radius of curvature and thereby decrease the electric field at the corners. This has been accomplished by, for example, oxidizing the entire inner surface of the newly formed trench, taking advantage of the fact that an exposed corner of a silicon layer etches faster than a flat surface of the silicon layer, thus forming a rounded upper corner at the top of the trench.

However, with SOI devices, the corner rounding solution leads to a new problem. The new problem in SOI devices arises as a result of the proximity of the dielectric insulation layer below the silicon active layer. In SOI devices, the shallow isolation trench is etched through the silicon layer to the insulation layer. When the exposed portion of the silicon on the sidewalls of the newly formed trench is oxidized during the process of rounding the corners, a wedge or "bird's beak" of new oxide may form on the underside of the silicon active layer adjacent the isolation trench, between the silicon active layer and the underlying layer of insulating material of the SOI wafer. Thus, as the oxide grows on the sidewalls of the trench, it may grow laterally between the lower edge of the silicon active layer and the underlying oxide insulation layer. In essence, during the process of oxidation which is intended to round the upper corner of the silicon active layer, the lower corner of the silicon active layer is also rounded, forming the bird's beak or oxide wedge between the silicon active layer and the underlying oxide insulation layer. The problem becomes manifest when, during subsequent high temperature processing steps, thermal expansion of the bird's beak creates strain-induced defects in the silicon crystal structure and/or lifts the silicon layer, due to the stress of the differently expanding oxide. The strain-induced defects in the crystal structure may change the electrical characteristics of the semiconductor. The lifting of the silicon layer distorts the surface of the semiconductor device from its desired planarity to an undesirable non-planar condition. As semiconductor device dimensions continue to become smaller, problems such as these both occur more easily and become less tolerable.

Thus, there exists a need for STI methodology applicable to SOI semiconductor devices wherein the problems resulting from sharp corners can be alleviated without creating the problems resulting from the bird's beak on the underside of the silicon active layer adjacent the isolation trench.

SUMMARY OF THE INVENTION

The present invention provides a method of avoiding formation of the "bird's beak" while providing rounded upper corners on the silicon active layer in shallow trench isolation of SOI semiconductor devices.

In one embodiment, the present invention relates to a method of isolation of active islands on a silicon-on-insulator semiconductor device, comprising the steps of:
  providing a silicon-on-insulator semiconductor wafer having a silicon active layer, a dielectric insulation layer and a silicon substrate, in which the silicon active layer is formed on the dielectric insulation layer and the dielectric insulation layer is formed on the silicon substrate;
  forming an isolation trench through the silicon active layer, the isolation trench defining at least one active island in the silicon active layer;
  depositing a passivating insulator in a lower portion of the isolation trench; and
  filling the isolation trench above the passivating insulator with a trench isolation material.

In one embodiment, the method further includes a step of rounding at least one corner of the active island in an upper portion of the silicon active layer.

In one embodiment, the step of depositing includes a directional deposition, whereby the passivating insulator is deposited substantially only in the lower portion of the isolation trench. In one embodiment, the directional deposition is by one of physical vapor deposition, sputtering, thermal CVD or a plasma enhanced method. In one embodiment, the step of depositing is followed by a step of etching away passivating insulator deposited on sidewalls of the isolation trench. In one embodiment, the step of depositing is followed by a step of selectively etching away passivating insulator deposited on sidewalls of the isolation trench.

In one embodiment, the method further comprises forming a liner in the isolation trench prior to filling the isolation trench.

In one embodiment, the passivating insulator comprises at least one of an oxide of silicon and a nitride of silicon.

In one embodiment, the insulation material is a dielectric. In one embodiment, the step of filling fills the isolation trench at least to a level substantially flush with an upper surface of the silicon active layer.

In another embodiment, the present invention relates to a method of isolation of active islands on a silicon-on-insulator semiconductor device, comprising the steps of:
  providing a silicon-on-insulator semiconductor wafer having a silicon active layer, a dielectric insulation layer and a silicon substrate, in which the silicon active layer is formed on the dielectric insulation layer and the dielectric insulation layer is formed on the silicon substrate;
  etching through the silicon active layer to form an isolation trench through the silicon active layer, the isolation trench defining at least one active island in the silicon active layer;
  depositing a passivating insulator substantially only at the lower portion of the isolation trench;
  rounding at least one corner of the active island in an upper portion of the silicon active layer;
  forming a liner in the isolation trench; and
  filling the isolation trench above the passivating insulator with a trench isolation material.

In one embodiment, the step of filling fills the isolation trench at least to a level substantially flush with an upper surface of the silicon active layer.

In one embodiment, the present invention relates to a silicon-on-insulator semiconductor device, including:
  a silicon-on-insulator wafer having a silicon active layer, a dielectric insulation layer a silicon substrate, and at least one isolation trench defining an active island in the silicon active layer, in which the silicon active layer is formed on the dielectric insulation layer and the dielectric insulation layer is formed on the silicon substrate;
  wherein the at least one isolation trench includes a layer of a passivating insulator in a lower portion of the isolation trench.

In one embodiment of the device, the isolation trench above the passivating insulator includes a trench isolation material. In one embodiment of the device, the dielectric insulation layer, the passivating insulator and the trench isolation material comprise silicon dioxide. In one embodiment of the device, the passivating insulator is in contact with the dielectric insulation layer.

Thus, the present invention provides methods of STI applicable to SOI semiconductor devices which do not suffer from problems resulting from formation of a "bird's beak" on the underside of the silicon active layer adjacent the isolation trench, while still allowing removal of the sharp corners from the silicon active islands.

DETAILED DESCRIPTION

The method of the present invention may be applied to a silicon-on-insulator (SOI) semiconductor wafer to form an SOI wafer including a shallow isolation trench having a passivating insulator deposited at the bottom of the shallow isolation trench at any time subsequent to the formation of a silicon-on-insulator (SOI) wafer. In one embodiment, the method is applied following fabrication of the SOI wafer and fabrication of at least some of the elements of a semiconductor device on the SOI wafer.

Figure 1:
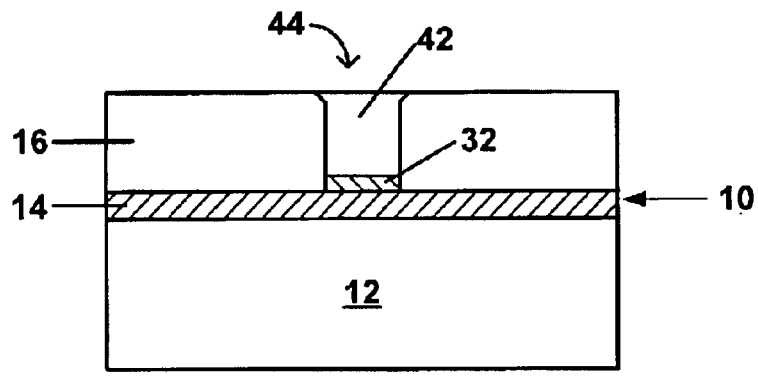
FIG. 1 is a partial cross-sectional view of an SOI wafer following formation of a shallow isolation trench including a passivating material as a trench bottom liner, in accordance with the present invention.

The present invention relates to an SOI wafer including a shallow trench isolation (STI) spacer between active islands, in which the STI spacer includes a layer of a passivating insulator at the bottom of the STI trench. FIG. 1 is a partial cross-sectional view of an SOI wafer 10 following formation of a shallow isolation trench including a passivating insulator as a trench bottom liner, in accordance with the present invention. The SOI wafer 10 shown in FIG. 1 includes a substrate 12, a dielectric insulation material layer 14 and an active silicon layer 16. The SOI wafer 10 further includes an STI spacer 44 shown in FIG. 1 is formed of a trench isolation material 42 and a layer of a passivating insulator 32.

The present invention relates to a method of isolation of active islands on an SOI semiconductor device. In the first step of the method, an SOI semiconductor wafer having a silicon active layer, a dielectric insulation layer and a silicon substrate is provided. In one embodiment, the silicon active layer is formed on the dielectric insulation layer and the dielectric insulation layer is formed on the silicon substrate. In one embodiment, the silicon active layer is a monocrystalline silicon. As used herein, the term "monocrystalline" means a crystal lattice structure substantially without defects in the crystal structure and containing few impurities. The SOI wafer may be formed by any technique known in the art for forming such wafers.

Figure 2:
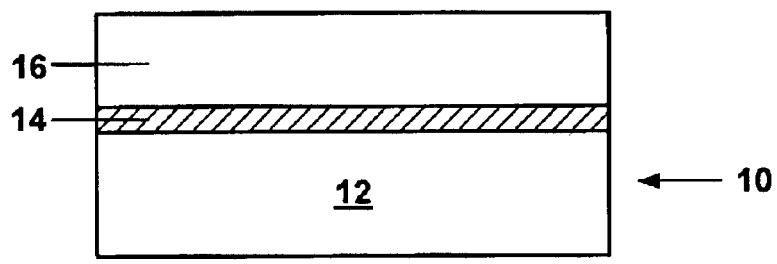
FIG. 2 is a partial cross-sectional view of an SOI wafer.

FIG. 2 shows a partial cross-sectional view of the SOI wafer 10, with the silicon substrate 12, the buried oxide layer 14 and the silicon active layer 16, prior to formation of a shallow trench isolation spacer. The silicon active layer 16 may include one or more semiconductor devices. In one embodiment, the silicon active layer 16 is part of a newly fabricated SOI wafer, in which semiconductor devices have not yet been fabricated. In one embodiment, the silicon active layer 16 is part of an SOI wafer in which a plurality of semiconductor devices have been formed, or are in the process of being formed. For example, the silicon active layer 16 may have been implanted with n- or p-dopants. In such embodiment, the silicon active layer 16 includes at least one semiconductor device element. The SOI wafer shown in FIG. 2 is only a small portion of a much larger SOI wafer, of which the silicon active layer 16 will be divided into a plurality of active islands, which may be isolated one from another by application of the method of the present invention. As will be understood by those of skill in the art, a cross-sectional view of a single isolation structure is shown in the drawings: of and described in the present disclosure, although the method is applicable to formation of a plurality of such isolation structures simultaneously.

The SOI wafer 10 used in the present invention may be any SOI wafer formed by any techniques known in the art for forming SOI wafers. The present invention, as described herein, is applied to a previously formed SOI wafer, and thus is not limited to any particular method of forming the SOI wafer. The present invention is broadly applicable to SOI-type devices including, e.g., silicon-on-sapphire (SOS) devices.

In the second step of the method of the present invention, an isolation trench is formed through the silicon active layer. By forming the isolation trench, at least one active island is defined in the silicon active layer. The isolation trench may be formed by a series of steps which are conventional, as will be recognized upon review of FIGS. 2–6. The following description relating to the steps of forming the isolation trench as illustrated in FIGS. 2–6 is merely exemplary. The step(s) of forming the isolation trench may be carried out by any known method for forming shallow isolation trenches. The method of the present invention is not limited to any particular process for forming the trench, since the features of the invention primarily relate to the subsequent steps, including, for example, deposition of the passivating insulator in the trench, and the subsequent steps.

Figure 3:
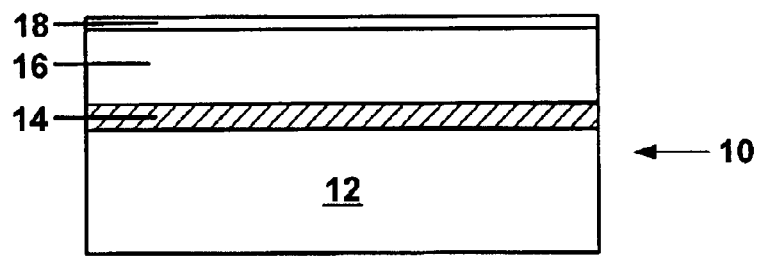
FIG. 3 is a partial cross-sectional view of an SOI wafer following application of a pad oxide layer.

In one embodiment, the step of forming the isolation trench includes forming a pad oxide layer 18 as shown in FIG. 3 on the surface of the SOI wafer 10, which may be the surface of the silicon active layer 16. In forming the pad oxide layer 18, which may also be referred to as a buffer oxide, a silicon dioxide ($SiO_2$) layer may be thermally grown on the surface of the SOI wafer 10. The pad oxide layer 18 may be formed by other known deposition methods. The pad oxide layer 18 serves to cushion the transition of stresses between the silicon active layer 16 and subsequently deposited layers, such as a hard mask layer. In one embodiment, the pad oxide layer 18 may be deposited by an alternative technique such as by chemical vapor deposition (CVD) or by a plasma-assisted deposition method.

Figure 4:
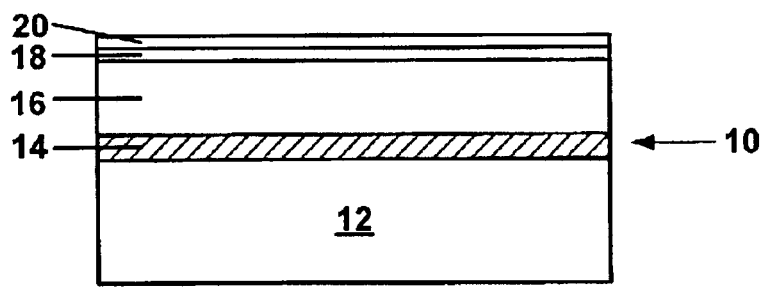
FIG. 4 is a partial cross-sectional view of the SOI wafer of FIG. 3 following application of a hard mask layer.

In one embodiment, the step of forming an isolation trench includes forming a hard mask layer 20 as shown in FIG. 4, such as a layer of silicon nitride ($Si_3N_4$) on the pad oxide layer 18. In an embodiment in which the hard mask layer 20 is a silicon nitride hard mask layer, it may be formed by any known technique, such as by a plasma deposition or a CVD method. The hard mask layer 20 may be formed of other known hard mask materials, which may be formed by other known techniques. The hard mask layer 20 serves to protect the underlying structural elements and to provide a base upon which an etch mask layer, such as a photoresist layer, may be deposited.

Figure 5:
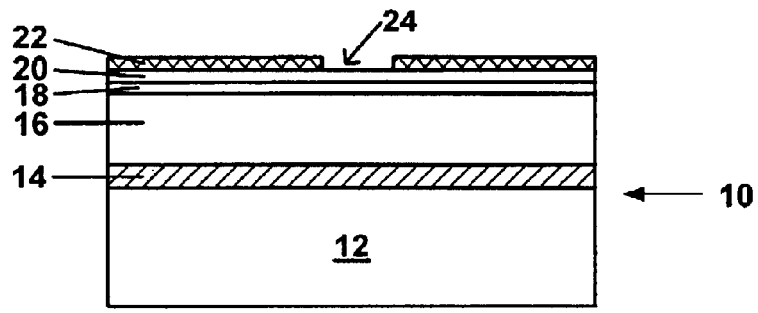
FIG. 5 is a partial cross-sectional view of the SOI wafer of FIG. 4 following application of a patterned photoresist layer.

In one embodiment, the step of forming an isolation trench includes forming a photoresist layer 22, as shown in FIG. 5 on the hard mask layer 20. This step includes patterning and developing the photoresist layer 22 into a predetermined resist pattern. This step may include forming the selected pattern by lithography, and thereafter developing the photoresist layer 22 to leave the selected pattern, e.g., on the hard mask layer 20, on the surface of the SOI semiconductor wafer 10. The photoresist layer 22 shown in FIG. 5 includes an opening or space 24 which schematically illustrates a gap in the pattern, and corresponds to the location at which the isolation trench will be formed in subsequent steps. In one embodiment, the pattern selected forms an pattern for isolation of the active islands of a plurality of semiconductor devices which have been formed on the SOI semiconductor wafer 10.

When the selected pattern has been formed in the photoresist layer 22, and the photoresist developed, the SOI wafer 10 can then be etched to form the at least one isolation trench. In one embodiment, the etching is an anisotropic etch, in which the etching takes place in the downward direction (from the silicon active layer 16 downward toward the substrate in, e.g., FIG. 5), but substantially not in a lateral direction. In one embodiment, the etching step to form the isolation trench is by reactive ion etching (RIE).

Figure 6:
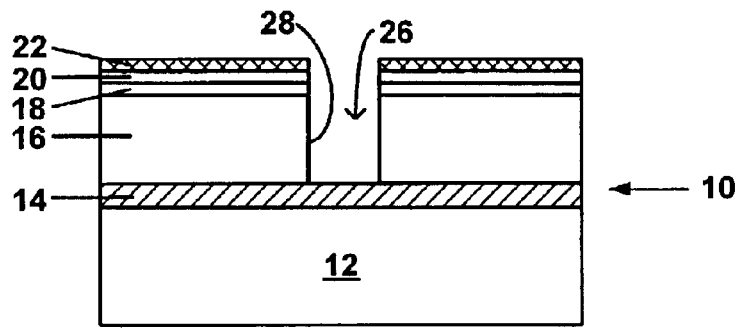
FIG. 6 is a partial cross-sectional view of the SOI wafer of FIG. 5 following one or more steps of etching to form an isolation trench.
Figure 7:
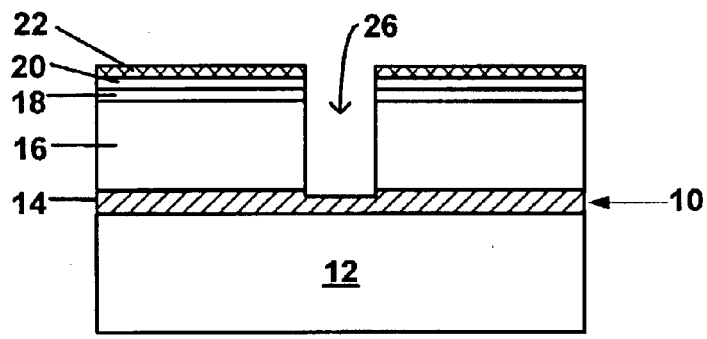
FIG. 7 is a partial cross-sectional view of an SOI wafer, similar to that of FIG. 6, in which the isolation trench-forming etch has etched into the buried oxide layer of the SOI wafer.

An isolation trench 26 is shown in FIG. 6. Any method known in the art for etching the various layers which have been applied over the silicon active layer 16 of the SOI wafer 10 may be used to form the isolation trench 26. In one embodiment, a series of etching steps is used, to etch first through the hard mask layer 20, then through the pad oxide layer 18, and finally through the silicon active layer 16. In one embodiment, the isolation trench 26 formed in the etching step of the present invention penetrates through the silicon active layer to the underlying insulation layer, as shown in FIG. 6. In one embodiment, the isolation trench 26 formed in the etching step penetrates through the silicon active layer 16 across the entire width of the isolation trench 26, leaving none of the original silicon of the silicon active layer in the isolation trench 26. In one embodiment, the isolation trench 26 formed in the etching step penetrates through the silicon active layer 16 slightly into the underlying insulation layer 14. FIG. 7 shows an embodiment in which the etching continued slightly into the oxide layer 14. However, the etching should not penetrate through the oxide layer 14.

In one embodiment, the isolation trench 26 does not reach the underlying insulation layer 14 across the full width of the isolation trench 26. However, in order to assure complete isolation of the plurality of active islands one from another, the etching step to form the isolation trench 26 should reach the underlying insulation layer 14 across at least a portion of the width along the entire length of the isolation trench 26. In other words, while the trench may not reach the insulation layer 14 across its full width, there is no semiconductor connection (i.e., the original silicon of the silicon active layer 16) remaining in contact with both sides of the isolation trench 26. Ideally, the etching step to form the isolation trench 26 should reach the underlying insulation layer 14 across its entire width along its entire length, but this may not always occur in actual practice.

The isolation trench 26 embodiment illustrated in FIGS. 7–10 includes sidewalls 28 shown to be vertical. In other embodiments, the side walls 28 may be formed at a slight non-vertical angle, due to the variations in the etching process, as would be recognized by those of skill in the art. Ideally, the etching step to form the isolation trench 26 should form a trench having vertical sidewalls 28, but in actual practice some departure from vertical may be observed.

Once the isolation trench 26 has been formed, the photoresist layer 22 may be removed. In one embodiment, the hard mask layer 20 may be removed at this time, in addition to removing the photoresist layer 22.

In the third step of the method of the present invention, a passivating insulator is deposited in a lower portion of the isolation trench. In one embodiment, the passivating insulator is formed by a directional deposition method. In one embodiment, the direction deposition method provides for application of the passivating insulator from a controlled direction, for example, perpendicular to the plane of the surface of the SOI wafer 10 (normal to the surface), so that the passivating insulator is deposited substantially only on the bottom, i.e., only at a lower portion, of the isolation trench 26. In one embodiment, the directional deposition method deposits the passivating insulator 32 only on the bottom 34 of the isolation trench 26.

Figure 8:
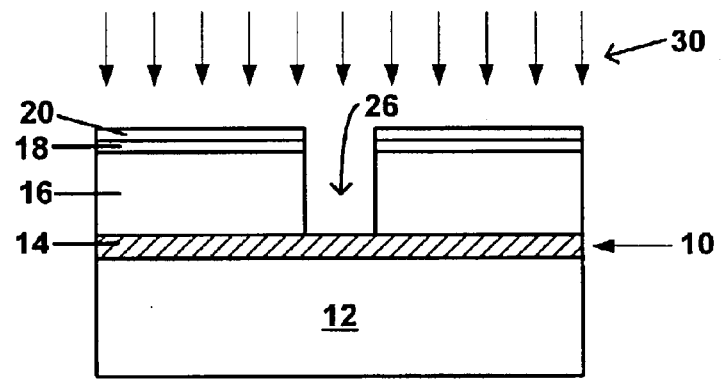
FIG. 8 is a partial cross-sectional view of the SOI wafer of FIG. 5 following removal of a photoresist, showing a directional deposition of a passivating insulator.

In one embodiment, the depositing step includes a directional deposition, whereby the passivating insulator 32 is deposited substantially only in the bottom 34 or lower portion of the isolation trench 26. FIG. 8 provides a schematic representation of a directional deposition. In FIG. 8, the SOI wafer 10 is shown following removal of the photoresist layer 22, during a step of depositing a passivating insulator. The embodiment shown in FIG. 8 includes a directional deposition of the passivating insulator, schematically represented by arrows 30. The arrows 30 are shown being directed at the surface of the SOI wafer 10 at an angle perpendicular to the surface of the SOI wafer 10, to represent the directional deposition. In such an embodiment, the passivating insulator should be deposited substantially only on the bottom or lower portion of the isolation trench 26. In one embodiment, described in more detail below, a small amount of the passivating insulator is deposited on the sidewalls 28 of the isolation trench 26.

Figure 9:
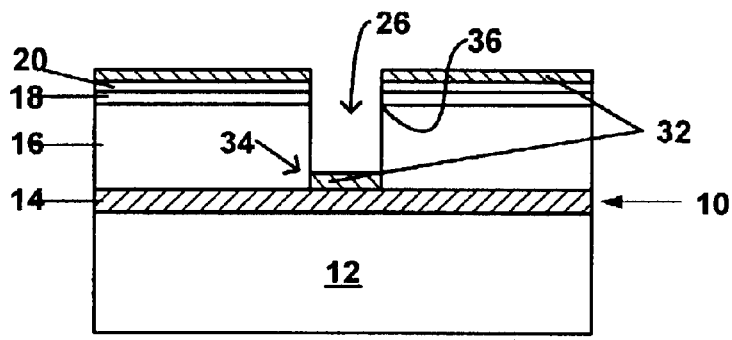
FIG. 9 is a partial cross-sectional view of an SOI wafer following application of a passivating insulator layer.

In FIG. 9, such a passivating insulator 32 is shown in a bottom or lower portion 34 of the isolation trench 26. In one embodiment, the passivating insulator 32 is deposited in the bottom 34 of the isolation trench 26. In one embodiment, the passivating insulator 32 is deposited in the bottom 34 of the isolation trench 26 to a depth sufficient to provide a protective shield or barrier, whereby when subsequent oxidation steps are carried out, a bird's beak of oxidized silicon of the silicon active layer 16 cannot form between the silicon active layer 16 and the underlying insulation layer 14 of the SOI wafer 10, as described in more detail below. As shown in FIG. 9, the passivating insulator 32 provides a shield between the isolation trench 26 and the lower portion of the silicon active layer 16. The shield provided by the passivating insulator 32 prevents formation of a bird's beak of oxidized silicon on the lower side of the silicon active layer 16, adjacent the dielectric insulation layer 14, which might otherwise result from oxidation during a subsequent rounding step. The passivating insulator 32 blocks access by oxygen to the lower portions of the trench, including particularly to lower edge of the active silicon layer 16. As known in the art and explained in the Background, it is oxidation of the lower part of the active silicon layer 16 which results in formation of the bird's beak. Thus, provision of the layer of passivating insulator 32 at the bottom of the trench forms a shield, thus avoiding formation of a bird's beak.

By use of the terms "lower portion" or "bottom", it is intended that the passivating insulator 32 be formed in a relatively thin layer covering the bottom 34 of the isolation trench 26 at least to a depth sufficient to avoid formation of a bird's beak in subsequent oxidation steps. The actual depth of the passivating insulator 32 may be selected by the fabricator based on factors such as the degree of protection required, the extent or duration of the subsequent oxidation steps, including the strength or harshness of the oxidation process employed, and the size of bird's beak which might otherwise be expected based on previous experience in formation of bird's beak. Thus, in one embodiment, the lower portion 34 of the isolation trench 26 is up to about 10% of the thickness of the silicon active layer 16. In one embodiment, the lower portion 34 of the isolation trench 26 is up to about 25% of the thickness of the silicon active layer 16.

The directional deposition step, shown schematically in FIG. 8, may be any such directional deposition method known in the art. In one embodiment, the directional deposition method may be sputtering. In one embodiment, the direction deposition method may be plasma vapor deposition (PVD). In one embodiment, the sputtering method may include one or more of collimated sputtering, RF sputtering, magnetron sputtering or evaporative sputtering. In one embodiment, the PVD method may be a collimated PVD. In one embodiment, the direction deposition method is thermal CVD. In one embodiment, the directional deposition method is ion metal plasma deposition. In one embodiment, the directional deposition method for depositing the passivating insulator 32 is a plasma enhanced process for providing $SiO_x$-filled gaps such as the methods disclosed in U.S. Pat. No. 6,106,678. Other known directional deposition methods may be employed.

In one embodiment, the directional deposition method deposits the passivating insulator 32 substantially only on the bottom 34 of the isolation trench 26, and not on the sidewalls 28 of the isolation trench 26. In one embodiment, a thin layer of the passivating insulator 32 is deposited on the sidewalls 28 of the isolation trench 26 to a degree requiring removal thereof. This is described in more detail below with respect to FIG. 10. In one embodiment, the quantity, measured as the thickness, of the passivating insulator 32 deposited on the sidewalls of the isolation trench 26 is substantially less than the quantity deposited on the bottom or at a lower portion of the isolation trench 26.

For example, in one embodiment of an isolation trench, having a depth of 0.5 microns and a width of 0.4 microns, when the passivating insulator 32 is deposited by a sputtering method, the thickness of the passivating insulator 32 deposited on the bottom of the isolation trench 26 may be in the range from about 0.05 to about 0.12 microns (about 50 nm to about 120 nm), while the thickness of the passivating insulator 32 deposited on the sidewalls may be in the range from about 0.005 to about 0.01 microns (about 5 nm to about 10 nm).

In one embodiment, in which a small amount of the passivating insulator has been deposited on the sidewalls of the isolation trench, an isotropic etching process may be applied to the isolation trench, both to the sidewalls and to the bottom. Due to the substantial difference in thickness between the passivating insulator on the sidewalls and that on the bottom of the isolation trench, the etching can be carried out so as to remove all or substantially all of the passivating insulator from the sidewalls, while leaving a sufficient quantity of the passivating insulator on the bottom of the isolation trench to provide the beneficial effects of the invention in the subsequent steps.

Figure 10:
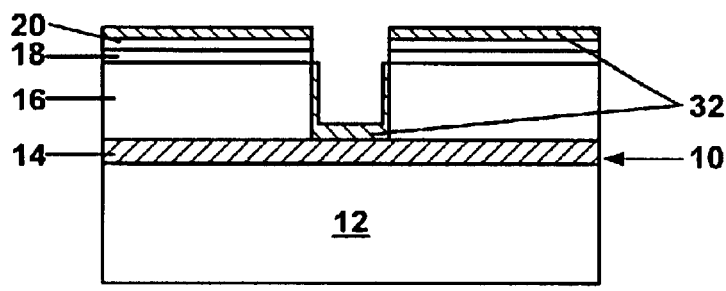
FIG. 10 is a partial cross-sectional view of an SOI wafer, similar to that of FIG. 8, following application of a passivating insulator layer, in which a portion of the passivating insulator material has become attached to sidewalls of the isolation trench.

FIG. 10 shows an example of an isolation trench in which the passivating insulator 32 has been directionally deposited, but a small amount of the passivating insulator 32 has become attached to the sidewalls 28 of the isolation trench 26. In this example, an isotropic etch, which by definition etches approximately equally in all directions, may be applied to remove all or substantially all of the passivating insulator 32 which has been deposited on the sidewalls 28 of the isolation trench 26, while leaving a substantial portion of the passivating insulator 32 on the bottom 34 of the isolation trench 26. After application of the isotropic etch, substantially all of the passivating insulator 32 can be removed from the sidewalls 28 of the isolation trench 26, leaving the SOI wafer 10 as shown in FIG. 9. As shown in FIG. 9, a substantial portion of the passivating insulator 32 remains on the bottom 34 of the isolation trench 26, and provides a significant thickness of the passivating insulator 32 over the dielectric insulation layer 14 and lower side of the silicon active layer 16 at the lower portion of the isolation trench 26.

As shown in FIG. 9, the passivating insulator 32 is also formed on the outer surfaces of the SOI wafer 10. In the embodiment illustrated in FIG. 9, the passivating insulator 32 is formed on the outer surface of the hard mask layer 20 of the SOI wafer 10.

The passivating insulator 32 may be any insulating material known in the art. In one embodiment, the passivating insulator 32 comprises at least one of an oxide of silicon and a nitride of silicon. In one embodiment, the passivating insulator 32 is silicon dioxide ($SiO_2$). In one embodiment, the passivating insulator 32 is silicon nitride ($Si_3N_4$). In one embodiment, the passivating insulator 32 is a mixture of an oxide and a nitride of silicon. In one embodiment, the passivating insulator 32 is silicon oxynitride ($Si_xO_yN_z$), in which x, y and z are selected to, yield a stoichiometrically neutral material, e.g., $Si_3N_2O_3$. In general, the silicon oxynitride is designated as simply SiON, which implicitly recognizes the unspecified stoichiometry. The passivating insulator 32 may be any other insulating or dielectric material, which contributes to the overall desired function of the trench isolation material and which also provides protection against formation of a bird's beak on the underside of the silicon active layer 16.

In the fourth step of the method of the present invention, at least one corner of the active island in an upper portion of the silicon active layer is rounded. The term "round" or "rounding" or "rounded" as used herein refers to the change in one or more corners of the silicon active layer 16 from a condition in which the corner is sharp and square or nearly square, to a condition in which the corner has been rounded or rendered not square. Rounding may include actual rounding, in which the corner is changed to have a radius of curvature, i.e., to include a "curved corner" having a regular curve, may include rounding in which the corner has an uneven, irregular curve such as an ellipsoid curve, may include chamfering, in which the corner is changed to have a chamfered face, and may include multiple chamfers, in which the corner is changed to have a series of chamfered faces, i.e., a "polygonal corner".

As shown in FIG. 9, the silicon active layer 16 includes an upper corner 36. If the corner 36 was not rounded, the sharpness of the corner 36 might result in the untoward effects described in the above background section.

Figure 11:
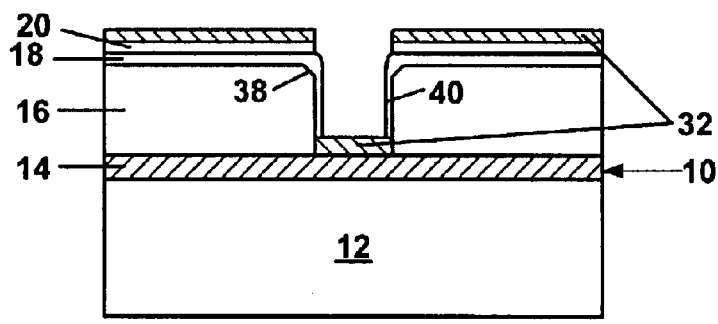
FIG. 11 is a partial cross-sectional view of an SOI wafer following a step of rounding, in which the upper corners of the silicon active layer have been rounded, and a liner has been formed in the isolation trench.

As shown in FIG. 11, a rounded corner 38 has been formed from the upper corner 36 of the silicon active layer 16 shown in FIG. 9. The specific embodiment shown in FIG. 11 has a silicon active layer 16 demonstrating an embodiment in which the rounded corner 38 is chamfered. While this chamfered embodiment is illustrated, the scope of the invention is not so limited to any particular "rounded" corner. As described above, the step of rounding the corner may produce a rounded corner 38 having a variety of shapes, with the only proviso being that the rounded corner 38 not cause the disfavored electronic effects which would result if the square corner 36 was allowed to remain in the SOI wafer 10.

In one embodiment, the rounded corner 38 is formed by an oxidation of the silicon of the silicon active layer 16 in the sidewall 28, in which the upper corner 36 of the silicon active layer 16 is rounded because the oxidation proceeds more rapidly at the corner than at a flat surface such as the sidewall 28. As shown in FIG. 11, a thin layer of a sidewall oxide 40 (in this embodiment) may be formed as a result of the corner rounding. The sidewall oxide 40 may thus be considered a liner in the isolation trench 26. Thus, in one embodiment, the method further includes forming a liner 40 in the isolation trench 26. This liner 40 is formed during the step of rounding, so that it is formed prior to a subsequent step of filling the isolation trench.

In other embodiments, the rounded corner may be formed by a reaction other than oxidation. Other agents which etch or otherwise react with the silicon of the silicon active layer 16 may be employed. In other embodiments, the upper rounded corner 36 may be formed by a reaction other than a thermal oxidization. Other methods known in the art for etching or otherwise reacting with the silicon of the silicon active layer 16 to round corners may be employed. Such other agents include, for example, chlorine together with oxygen, as described in U.S. Pat. No. 6,150,234. Any method known in the art for rounding such corners may be employed in the method of the present invention.

In practice, oxidation is generally preferred since it produces an insulating dielectric material for the sidewall oxide 40 which may be allowed to remain on the sidewalls 28 and need not be removed. Of course, if so desired, the sidewall oxide 40 may be removed. In one embodiment, the sidewall oxide 40 is silicon dioxide. In one embodiment, the sidewall oxide 40 is silicon dioxide and the passivating insulator 32 is silicon oxide. In one embodiment, the sidewall oxide 40 is silicon dioxide, the passivating insulator 32 is silicon oxide and these two elements form a combined structure in which the two materials are joined and in which there is no definite line of separation between them, although they have been formed in separate, different steps.

Following the corner rounding, or in a simultaneous action, as mentioned above, the liner 40 may be formed on the sidewalls 28 of the isolation trench 26. In one embodiment, the liner 40 may be formed by a thermal oxidation of the silicon surface of the sidewall 28 at a temperature of about 1000° C. in an oxygen containing atmosphere. In one embodiment, this thermal oxidation is used both to round the corners 36 forming the rounded corners 38, and to form the liner 40. In one embodiment, the thermal oxidation is used to simultaneously form the rounded corners 38 and to form the liner 40.

In an embodiment in which the rounding step produces "round" rounded corners, the radius of curvature should be at least about 50 nm. In an embodiment in which the rounding step produces polygonal rounded corners 38, a theoretical radius of curvature obtained by connecting the side intersections of the polygon should be at least about 50 nm. In one embodiment, the radius of curvature is in the range from about 50 nm to about 100 nm. In one embodiment, the radius of curvature is in excess of 100 nm. The radius of curvature is dependent of the method used to generate the rounding. The radius of curvature is scalable, and will continue to change as device dimensions become smaller. The radius of curvature is independent of the thickness of the silicon active layer 16.

In the fifth step of the method of the present invention, the isolation trench is filled with a trench isolation material. The trench isolation material may be any material known in the art for use as an isolation material for shallow trench isolation in semiconductor devices. The present method is not limited to any particular trench isolation material.

Figure 12:
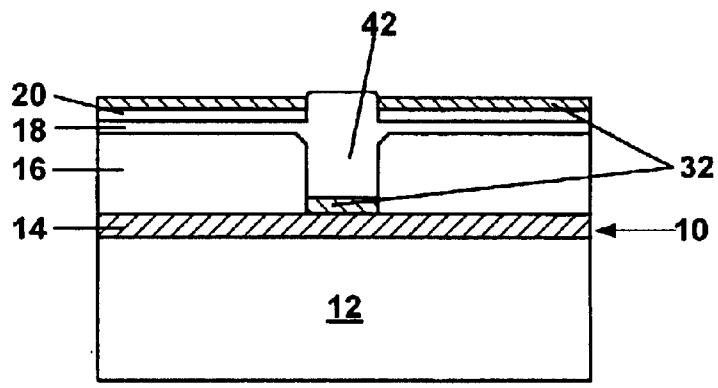
FIG. 12 is a partial cross-sectional view of an SOI wafer following a step of filling the isolation trench with an isolation material.

As shown in FIG. 12, in one embodiment, a trench isolation material 42 is formed so as to fill the isolation trench 26 from a level beginning at the upper surface of the passivating insulator 32 to a level above the silicon active layer 16, the pad oxide layer 18 and the hard mask layer 20. In one embodiment, the isolation trench 26 is filled with the trench isolation material 42 from above the passivating insulator 32 at least to a level above the upper surface of the silicon active layer 16. In one embodiment, the isolation trench 26 is filled with the trench isolation material 42 from the upper surface of the passivating insulator 32 to a level above the upper surface of the silicon active layer 16. In one embodiment, the step of filling fills the isolation trench 26 at least to a level substantially flush with an upper surface of the silicon active layer 16.

The trench isolation material 42, shown in FIG. 12, may be formed of any material known in the art. In one embodiment, the trench isolation material 42 is an oxide. In one embodiment, the trench isolation material 42 is an oxide of silicon. In one embodiment, the trench isolation material 42 is silicon dioxide, $SiO_2$. The trench isolation material may comprise other dielectric materials, such as silicon nitride or silicon oxynitride, which can provide the unction of electrically isolating adjacent silicon active islands on an SOI wafer from each other, and which may be deposited by a convenient method.

The trench isolation material 42, shown in FIG. 12, may be deposited in the isolation trench 26 by any method known in the art. In one embodiment, the trench isolation material 42 is deposited by CVD. In one embodiment, the trench isolation material 42 is deposited by plasma enhanced CVD. In one embodiment, the isolation material 42 is deposited by high density plasma (HDP). In one embodiment, the trench isolation material 42 is deposited by sputtering. In one embodiment, the trench isolation material 42 is deposited by plasma vapor deposition (PVD). In one embodiment, the sputtering method may include one or more of collimated sputtering, RF sputtering, magnetron sputtering or evaporative sputtering. In one embodiment, the PVD method may be a collimated PVD. In one embodiment, the method is thermal CVD. In one embodiment, trench isolation material 42 is deposited by ion metal plasma deposition. In one embodiment, trench isolation material 42 is deposited by a plasma enhanced process for providing $SiO_x$-filled gaps such as the methods disclosed in U.S. Pat. No. 6,106,678. Other known directional deposition methods may be employed.

The trench isolation material 42 may be applied by forming a layer of the material over the entire surface of the SOI wafer 10, which includes filling all gaps such as the isolation trench 26. The trench isolation material 42 may be applied by any method known in the art for forming and applying such materials. In an embodiment in which the trench isolation material 42 is an oxide of silicon, the material may be applied by CVD.

As suggested by FIG. 12, in an embodiment in which the pad oxide layer 18, the trench isolation material 42, and any trench liner material 40 are all the same material or are similar materials, these structures may form a combined structure of which the parts are essentially indistinguishable from each other, although they were formed by different process steps at different times in the method of the present invention. In one embodiment, pad oxide layer 18, the trench isolation material 42, and any trench liner material 40 are all silicon dioxide. In one such embodiment, these parts are indistinguishable from each other except at a microscopic or crystallographic scale.

Following deposition of the trench isolation material 42, excess material is removed from the SOI wafer 10, to produce an SOI wafer 10 as shown in FIG. 1, in which respective silicon active layers of adjacent silicon active islands have been separated by a shallow trench isolation spacer 44. The spacer 44 shown in FIG. 1 is formed of the trench isolation material 42 and the passivating insulator 32.

The excess material which is removed from the SOI wafer includes any layers applied in carrying out the method of the present invention, such as the pad oxide layer 18 and the hard mask layer 20, and any excess trench isolation material 42. These layers and any other excess materials are removed by techniques known in the art.

In one embodiment, as a final step in removing excess material, the surface of the SOI wafer 10, including the portion of the surface formed by the trench isolation material 42, may be polished by chemical mechanical polishing, if appropriate given the other structures which may be present on the SOI wafer 10. In an embodiment in which semiconductor devices have previously been formed on the SOI wafer 10, such polishing may not be appropriate.

Figure 13:
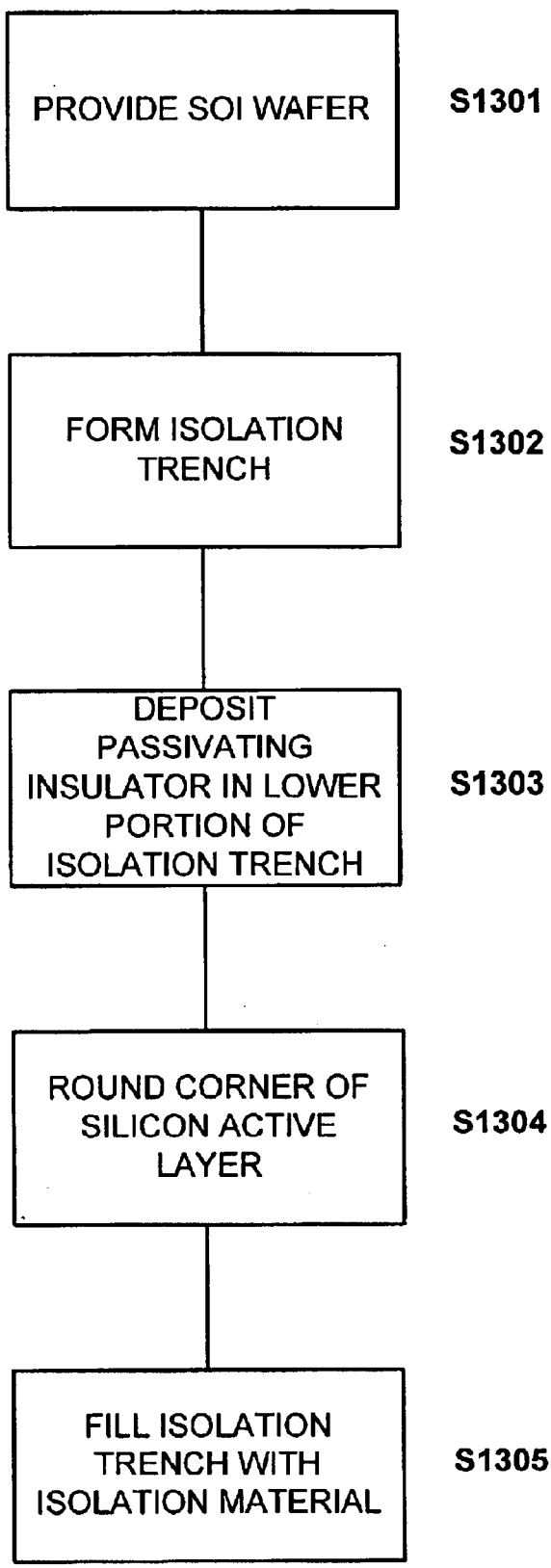
FIG. 13 is a flow diagram of one embodiment of a method of isolation of active islands on an SOI wafer.
Figure 14:
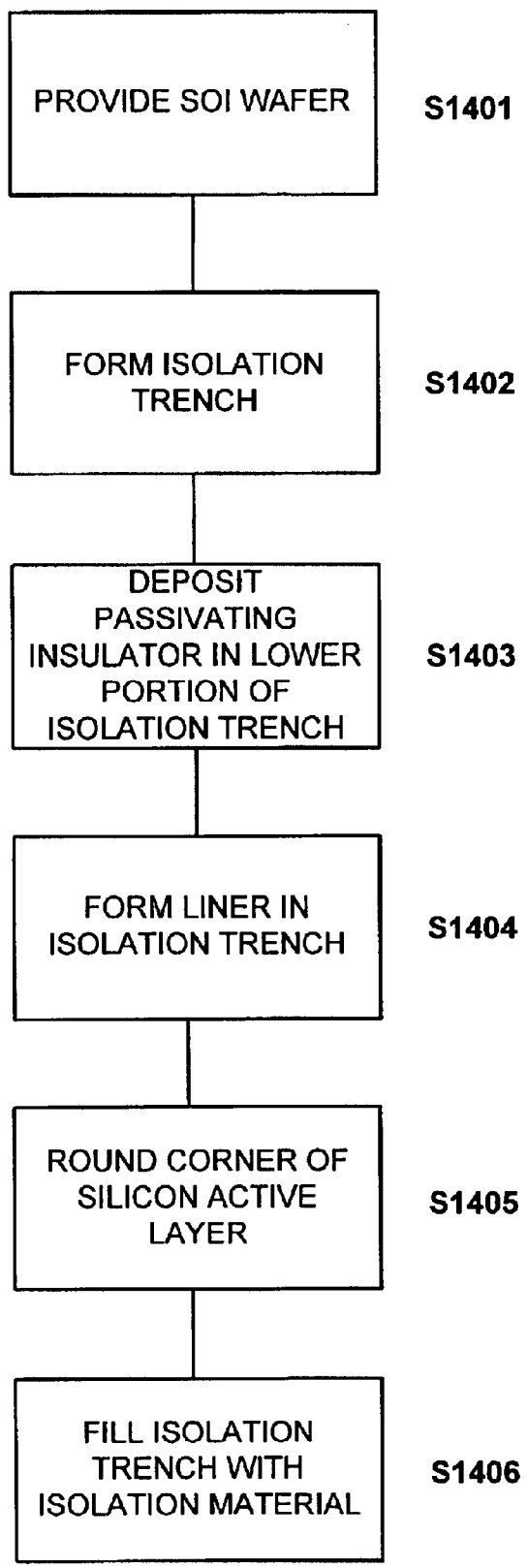
FIG. 14 is a flow diagram of another embodiment of a method of isolation of active islands on an SOI wafer.

FIGS. 13 and 14 are block flow diagrams illustrating the methods of the present invention. As shown in FIG. 13, in one embodiment, the present invention relates to a method of isolation of active islands on a silicon-on-insulator semiconductor device. A first step, shown in FIG. 13, is step S1301, in which a silicon-on-insulator semiconductor wafer is provided. The SOI wafer includes a silicon active layer, a dielectric insulation layer and a silicon substrate, in which the silicon active layer is formed on the dielectric insulation layer and the dielectric insulation layer is formed on the silicon substrate. The SOI wafer may be made by any method known in the art.

In a second step, step S1302 in FIG. 13, an isolation trench is formed through the silicon active layer. In one embodiment, the isolation trench thus formed defines at least one active island in the silicon active layer. The step S1302 may include one or a plurality of additional steps, such as forming a pad oxide layer, forming a hard mask layer, and forming a photoresist layer having a predetermined pattern by lithography.

In a third step, step S1303 in FIG. 13, a passivating insulator is deposited in a lower portion of the isolation trench. In one embodiment, the passivating insulator is deposited by a directional deposition method. In one embodiment, the passivating insulator is formed substantially only in the bottom of the isolation trench. In one embodiment, the passivating insulator is formed on both the bottom and the sidewalls of the isolation trench, but the quantity deposited on the bottom is substantially greater than the quantity deposited on the sidewalls. In one embodiment, the third step includes application of an isotropic etch, in which the passivating insulator formed on the sidewalls is removed, while the passivating insulator formed at the bottom of the isolation trench substantially remains.

In the fourth step, step S1304 in FIG. 13, at least one corner of the active island in an upper portion of the silicon active layer is rounded by reacting the exposed surface of the silicon active layer, and particularly the upper corner of the silicon active layer adjacent the isolation trench, with a suitable reagent. In one embodiment, the corner is provided With a round curvature, in one embodiment with an ellipsoid curvature, in one embodiment with a polygonal shape, and in one embodiment with a chamfered shape. Each of the foregoing embodiments constitute rounding of the corner of the silicon active layer.

In the fifth step, step S1305 in FIG. 13, the isolation trench is filled, from a level above the passivating insulator, to a level at least above the upper surface of the silicon active layer, with a trench isolation material. In one embodiment, the trench is filled with a trench isolation material from a level above the passivating insulator to a level above the top surface of the highest layer which has been applied over the surface of the SOI wafer.

FIG. 14 illustrates another embodiment of the method of the present invention. As shown in FIG. 14, in one embodiment, the present invention relates to a method of isolation of active islands on a silicon-on-insulator semiconductor device. A first step, shown in FIG. 14, is step S1401, in which a silicon-on-insulator semiconductor wafer is provided. The SOI wafer includes a silicon active layer, a dielectric insulation layer and a silicon substrate, in which the silicon active layer is formed on the dielectric insulation layer and the dielectric insulation layer is formed on the silicon substrate.

In a second step, step S1402 in FIG. 14, an isolation trench is formed through the silicon active layer. In one embodiment, the isolation trench thus formed defines at least one active island in the silicon active layer. The step S1402 may include a one or a plurality of additional steps, such as forming a pad oxide layer, forming a hard mask layer, and forming a photoresist layer having a predetermined pattern by lithography.

In a third step, step S1403 in FIG. 14, a passivating insulator is deposited in a lower portion of the isolation trench. In one embodiment, the passivating insulator is deposited by a directional deposition method. In one embodiment, the passivating insulator is formed substantially only in the bottom of the isolation trench. In one embodiment, the passivating insulator is formed on both the bottom and the sidewalls of the isolation trench, but the quantity deposited on the bottom is substantially greater than the quantity deposited on the sidewalls.

In the fourth step, step S1404 in FIG. 14, a liner is formed in the isolation trench. In one embodiment, the liner is an oxide liner. In one embodiment, the liner is silicon dioxide. In one embodiment, the liner is formed simultaneously with the following step of rounding. In one embodiment, the liner is formed simultaneously with the passivating insulator and is formed of the same material as the passivating insulator.

In the fifth step, step S1405 in FIG. 14, at least one corner of the active island in an upper portion of the silicon active layer is rounded by reacting the exposed surface of the silicon active layer, and particularly the upper corner of the silicon active layer adjacent the isolation trench with a suitable reagent. In one embodiment, the corner is provided with a round curvature, in one embodiment with an ellipsoid curvature, in one embodiment with a polygonal shape, and in one embodiment with a chamfered shape. Each of the foregoing embodiments constitute rounding of the corner of the silicon active layer.

In the sixth step, step S1406 in FIG. 14, the isolation trench is filled, from a level above the passivating insulator, to a level at least above the upper surface of the silicon active layer, with a trench isolation material. In one embodiment, the trench is filled with a trench isolation material from a level above the passivating insulator to a level above the top surface of the highest layer which has been applied over the surface of the SOI wafer.

Following the steps of the present invention, the SOI wafer may be further processed in the fabrication of semiconductor devices in a known manner.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A silicon-on-insulator semiconductor device, comprising:
   a silicon-on-insulator wafer having a silicon active layer, a dielectric insulation layer, a silicon substrate, and at least one isolation trench defining an active island in the silicon active layer, in which the silicon active layer is formed on the dielectric insulation layer and the dielectric insulation layer is formed on the silicon substrate;
   wherein the at least one isolation trench includes a layer of a passivating insulator in a lower portion of the isolation trench and in contact with the dielectric insulation layer, the passivating insulator having a depth sufficient to provide a protective shield or barrier whereby a bird's beak cannot form between the silicon active layer and the dielectric insulation layer,
   wherein the isolation trench above the passivating insulator is filled with a dielectric trench isolation material.

2. The silicon-on-insulator semiconductor device of claim 1, wherein each of the dielectric insulation layer, the passivating insulator and the dielectric trench isolation material comprise silicon dioxide.

3. The silicon-on-insulator semiconductor device of claim 1, wherein the trench isolation material is on the passivating insulator.

4. The silicon-on-insulator semiconductor device of claim 1, wherein the isolation trench further comprises a sidewall oxide liner.

5. The silicon-on-insulator semiconductor device of claim 1, wherein the isolation trench further comprises rounded upper corners.

6. The silicon-on-insulator semiconductor device of claim 1, wherein the device is free of a bird's beak in the lower portion of the isolation trench between the silicon active layer and the dielectric insulation layer adjacent the isolation trench.

7. The silicon-on-insulator semiconductor device of claim 1, wherein the passivating insulator has a depth and width sufficient provide a protective shield or barrier to prevent formation of a bird's beak in the lower portion of the isolation trench between the silicon active layer and the dielectric insulation layer adjacent the isolation trench.

8. The silicon-on-insulator semiconductor device of claim 1, wherein the passivating insulator comprises at least one of an oxide of silicon, a nitride of silicon, a mixture thereof or a mixed oxide and nitride of silicon.

9. The silicon-on-insulator semiconductor device of claim 1, wherein the passivating insulator forms an extension of the dielectric insulation material, the extension extending upward into the isolation trench, shielding a lower portion of the isolation trench, and preventing formation of a bird's beak in the lower portion of the isolation trench between the silicon active layer and the dielectric isolation layer adjacent the isolation trench.

10. A silicon-on-insulator semiconductor device, comprising:
    a silicon-on-insulator wafer having a silicon active layer, a dielectric insulation layer, a silicon substrate, and at least one isolation trench defining an active island in the silicon active layer, in which the silicon active layer is formed on the dielectric insulation layer and the dielectric insulation layer is formed on the silicon substrate;
    wherein the at least one isolation trench comprises rounded upper corners, a layer of a passivating insulator in a lower portion of the isolation trench and in contact with the dielectric insulation layer, a sidewall oxide liner, and a dielectric trench isolation material filling the isolation trench, the passivating insulator having a depth sufficient to provide a protective shield or barrier whereby a bird's beak cannot form between the silicon active layer and the dielectric insulation layer.

11. The silicon-on-insulator semiconductor device of claim 10, wherein each of the dielectric insulation layer, the passivating insulator and the trench isolation material comprise silicon dioxide.

12. The silicon-on-insulator semiconductor device of claim 10, wherein the device is free of a bird's beak in the lower portion of the isolation trench between the silicon active layer and the dielectric insulation layer adjacent the isolation trench.

13. The silicon-on-insulator semiconductor device of claim 10, wherein the passivating insulator has a depth and width sufficient provide a protective shield or barrier to prevent formation of a bird's beak in the lower portion of the isolation trench between the silicon active layer and the dielectric insulation layer adjacent the isolation trench.

14. The silicon-on-insulator semiconductor device of claim 10, wherein the passivating insulator comprises at least one of an oxide of silicon, a nitride of silicon, a mixture thereof or a mixed oxide and nitride of silicon.

15. The silicon-on-insulator semiconductor device of claim 10, wherein the passivating insulator forms an extension of the dielectric insulation material, the extension extending upward into the isolation trench, shielding a lower portion of the isolation trench, and preventing formation of a bird's beak in the lower portion of the isolation trench between the silicon active layer and the dielectric insulation layer adjacent the isolation trench.

16. A silicon-on-insulator semiconductor device, comprising:
    a silicon-on-insulator wafer having a silicon active layer, a dielectric insulation layer, a silicon substrate, and at least one isolation trench defining an active island in the silicon active layer, in which the silicon active layer is formed on the dielectric insulation layer and the dielectric insulation layer is formed on the silicon substrate;
    wherein the at least one isolation trench comprises rounded upper corners, a layer of a passivating insulator in a lower portion of the isolation trench and in contact with the dielectric insulation layer, a sidewall oxide liner, and a dielectric trench isolation material filling the isolation trench, and the device is free of a bird's beak in the lower portion of the isolation trench between the silicon active layer and the dielectric insulation layer adjacent the isolation trench, the passivating insulator having a depth sufficient to provide a protective shield or barrier whereby a bird's beak cannot form between the silicon active layer and the dielectric insulation layer.

17. The silicon-on-insulator semiconductor device of claim 16, wherein the passivating insulator has a depth and width sufficient provide a protective shield or barrier to prevent formation of a bird's beak in the lower portion of the isolation trench between the silicon active layer and the dielectric insulation layer adjacent the isolation trench.

18. The silicon-on-insulator semiconductor device of claim 16, wherein the passivating insulator comprises at least one of an oxide of silicon, a nitride of silicon, a mixture thereof or a mixed oxide and nitride of silicon.

19. The silicon-on-insulator semiconductor device of claim 16, wherein the passivating insulator forms an extension of the dielectric insulation material, the extension extending upward into the isolation trench, shielding a lower portion of the isolation trench, and preventing formation of a bird's beak in the lower portion of the isolation trench between the silicon active layer and the dielectric insulation layer adjacent the isolation trench.

\* \* \* \* \*

UNITED STATES PATENT AND TRADEMARK OFFICE
CERTIFICATE OF CORRECTION

PATENT NO.    : 6,747,333 B1                                              Page 1 of 1
DATED         : June 8, 2004
INVENTOR(S)   : Xiang et al.

It is certified that error appears in the above-identified patent and that said Letters Patent is hereby corrected as shown below:

Column 12,
Line 23, change "unction" with -- function --

Column 13,
Line 63, replace "With" with -- with --

Signed and Sealed this

Twenty-third Day of November, 2004

JON W. DUDAS
*Director of the United States Patent and Trademark Office*